(12) United States Patent
Torazawa et al.

(10) Patent No.: US 11,276,596 B2
(45) Date of Patent: Mar. 15, 2022

(54) CONVEYANCE SYSTEM

(71) Applicant: MURATA MACHINERY, LTD., Kyoto (JP)

(72) Inventors: Masayoshi Torazawa, Inuyama (JP); Kazuhiro Ishikawa, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 201 days.

(21) Appl. No.: 16/756,493

(22) PCT Filed: Sep. 25, 2018

(86) PCT No.: PCT/JP2018/035282
§ 371 (c)(1),
(2) Date: Apr. 16, 2020

(87) PCT Pub. No.: WO2019/087618
PCT Pub. Date: May 9, 2019

(65) Prior Publication Data
US 2020/0343118 A1    Oct. 29, 2020

(30) Foreign Application Priority Data

Oct. 31, 2017  (JP) .............................. JP2017-210120

(51) Int. Cl.
*H01L 21/677*  (2006.01)
*B65G 1/04*  (2006.01)

(52) U.S. Cl.
CPC ...... *H01L 21/67727* (2013.01); *B65G 1/0464* (2013.01); *B65G 1/0492* (2013.01); *H01L 21/6773* (2013.01); *H01L 21/67724* (2013.01); *H01L 21/67733* (2013.01); *B65G 2201/0297* (2013.01)

(58) Field of Classification Search
CPC ............ H01L 21/67733; B65G 1/0478; B65G 1/0464
See application file for complete search history.

(56) References Cited

U.S. PATENT DOCUMENTS

| 2016/0145043 | A1* | 5/2016 | Van Den Berk | B65G 1/0492 700/217 |
| 2016/0272468 | A1* | 9/2016 | Izumi | B66C 9/02 |
| 2019/0019707 | A1 | 1/2019 | Suzuki | |
| 2020/0071077 | A1* | 3/2020 | Winkler | B65G 1/06 |

* cited by examiner

*Primary Examiner* — Gerald McClain
(74) *Attorney, Agent, or Firm* — Keating & Bennett, LLP

(57) ABSTRACT

A conveyance system includes a traveling area and a suspension traveling vehicle. The traveling area includes a grid area and a linear area. In the grid area, since first tracks are disposed side by side and second tracks are disposed side by side so that the first tracks and the second tracks intersect, the grid area includes unit blocks of the same shape or substantially the same shape surrounded by the first tracks and the second tracks. Both the first tracks and the second tracks surrounding the unit blocks are provided with an interstice that allows a supporting body to pass, and the interstice is perpendicular or substantially perpendicular to a longitudinal direction of each track. A traveling direction is the same or substantially the same as the first direction or the second direction in the linear area, and the interstice perpendicular or substantially perpendicular to the traveling direction is not provided in the linear area.

4 Claims, 5 Drawing Sheets

CONVEYANCE SYSTEM

BACKGROUND OF THE INVENTION

1. Field of the Invention

The present invention relates mainly to a conveyance system.

2. Description of the Related Art

Conventionally, in facilities such as a semiconductor manufacturing facility, a conveyance system including a track and a traveling vehicle that travels along the track is used in order to convey various types of articles. This type of conveyance system is disclosed in Japanese Patent Application Laid-Open No. 2016-175506, for example.

In the conveyance system of Japanese Patent Application Laid-Open No. 2016-175506, the tracks extending in two directions orthogonal each other are disposed side by side, and the overhead traveling vehicle travels along the tracks. A load port for handling semiconductor wafers conveyed by the overhead traveling vehicle, a buffer for temporarily storing the semiconductor wafers to be transferred to the load port, and the like are disposed under the tracks.

Since the traveling vehicle travels along the track, the load port, the buffer and the like described above can only be disposed just below the track. In the conveyance system of Japanese Patent Application Laid-Open No. 2016-175506, the size of the area surrounded by the track is non-uniform. If a conveyance system has such a track, there is room for improvement because the space of the facility is not fully utilized.

SUMMARY OF THE INVENTION

Preferred embodiments of the present invention provide conveyance systems in each of which a track is disposed so that space is effectively utilized.

Problems to be solved by the present invention are as described above. Solutions to the problems and advantageous effects thereof will now be described.

A first aspect of a preferred embodiment of the present invention provides a conveyance system that includes a traveling area and a suspension traveling vehicle. The traveling area includes a plurality of first tracks disposed along a first direction and a plurality of second tracks disposed along a second direction perpendicular or substantially perpendicular to the first direction. The suspension traveling vehicle includes a supporting body, and travels on the traveling area while being supported by the first track or the second track by the supporting body. The traveling area includes a grid area and a linear area. In the grid area, the plurality of the first tracks are disposed side by side, and the plurality of the second tracks are disposed side by side so that the first tracks and the second tracks intersect. Consequently, the grid area includes a plurality of unit blocks of the same shape or substantially the same shape surrounded by the first tracks and the second tracks. In the grid area, both the first tracks and the second tracks surrounding the unit blocks are provided with an interstice to allow the supporting body to pass, and the interstice is perpendicular or substantially perpendicular to the longitudinal direction of each track (the first track or the second track). In the linear area, a traveling direction is the same or substantially the same as the first direction or the second direction, and the interstice perpendicular or substantially perpendicular to the traveling direction is not provided in the linear area.

Accordingly, since the plurality of the first tracks and the plurality of the second tracks are disposed so as to have the plurality of the unit blocks of the same shape or substantially the same shape in the grid area, articles can be conveyed to various positions in various paths in the grid area. In the grid area, because of traveling of the suspension traveling vehicle in various directions and a large number of interstices to allow the supporting body to pass, the suspension traveling vehicle tends to be vibrated by riding over the interstices. Thus, it is preferable that the suspension traveling vehicle travels at a relatively low speed in the grid area. In this regard, a preferred embodiment of the present invention includes the linear area in addition to the grid area. Since the suspension traveling vehicle can travel only in a predetermined travel direction in the linear area, no other suspension traveling vehicle enters the linear area from a direction crossing the travel direction. Therefore, since the possibility of collision of the suspension traveling vehicles is extremely low in the linear area, the suspension traveling vehicle can be allowed to travel at high speed. In particular, since the interstice perpendicular or substantially perpendicular to the traveling direction is not provided in the linear area, the vibration in the linear area of the suspension traveling vehicle during the traveling is reduced as compared with vibration in the grid area. Therefore, in the linear area, even when an article which is vulnerable to vibration is conveyed, the suspension traveling vehicle can be allowed to travel at high speed.

In the conveyance system, it is preferable that a maximum traveling setting speed of the suspension traveling vehicle in the linear area is faster than a maximum traveling setting speed of the suspension traveling vehicle in the grid area.

This makes it possible to utilize the feature of the linear area that the suspension traveling vehicle can be allowed to travel at high speed.

The conveyance system described above preferably includes the following features. That is, the suspension traveling vehicle travels while suspending an article to be conveyed. An accommodating area for accommodating the article is provided below the grid area.

Accordingly, a space below the grid area can be utilized. In particular, by shortening intervals between the first tracks and the second tracks, the space below the grid area can be more effectively utilized.

The conveyance system described above preferably includes the following features. That is, the article is a storage container to store a semiconductor wafer. The accommodating area is provided with a load port where the semiconductor wafer is transferred to a processing device that processes the semiconductor wafer, or a storage to temporarily store the storage container to be transferred the semiconductor wafer to the load port.

Accordingly, since the semiconductor wafer is sensitive, the feature of the present invention that the vibration is reduced or minimized and conveying at high speed can be effectively utilized. The accommodating area is provided with the load port or the storage, so the space below the grid area can be effectively utilized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
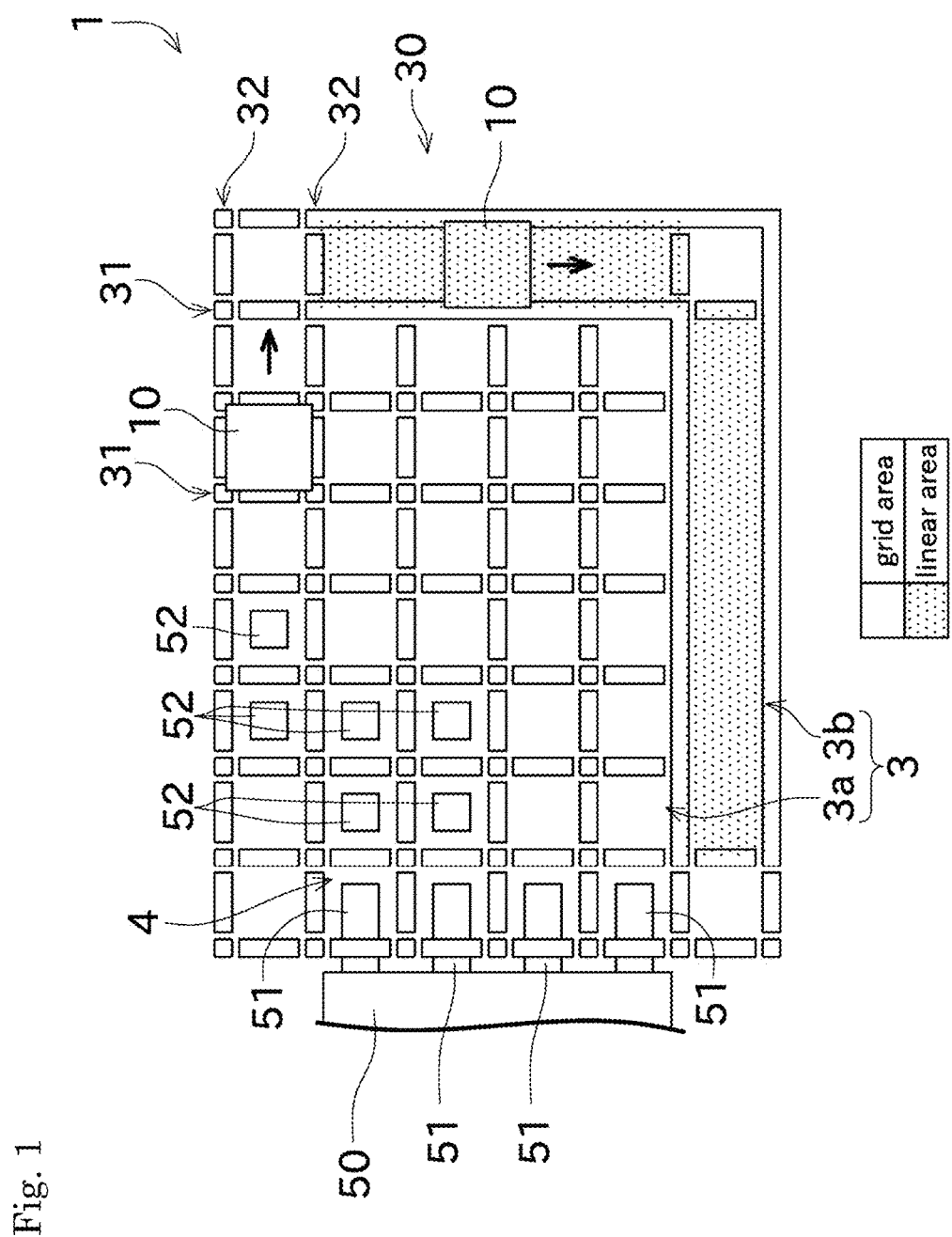
FIG. 1 is a schematic plan view showing a configuration of a conveyance system of a first preferred embodiment of the present invention.

Preferred embodiments of the present invention will be described with reference to the drawings. First, referring to FIG. 1, a schematic configuration of a conveyance system 1 will be described. FIG. 1 is a schematic plan view showing a configuration of a conveyance system 1 of a first preferred embodiment of the present invention.

The conveyance system 1 is preferably installed in a facility such as a semiconductor manufacturing facility, and the conveyance system 1 is a system for transporting various articles. An article conveyed by the conveyance system 1 may be, for example, a FOUP that accommodates semiconductor wafers, a reticle pod that accommodates reticles, or the like. As shown in FIG. 1, the conveyance system 1 includes a track 30 and suspension traveling vehicles 10. The number of the suspension traveling vehicle 10 may be one or plural.

The track 30 constitutes traveling area 3. The traveling area 3 includes a grid area 3a and a linear area 3b. The track 30 is suspended from a ceiling by a mounting member (not shown). The track 30 includes a plurality of first tracks 31 and a plurality of second tracks 32. Both the first tracks 31 and the second tracks 32 are linear tracks. The first tracks 31 and the second tracks 32 are perpendicular or substantially perpendicular to each other in a plan view. Hereinafter, a longitudinal direction of the first track 31 may be referred to a first direction, and a longitudinal direction of the second track 32 may be referred to a second direction. The grid area 3a and the linear area 3b shown in FIG. 1 will be described later.

The suspension traveling vehicle 10 travels along the track 30 while being suspended from the track 30. Specifically, the suspension traveling vehicle 10 can travel in the first direction by rotating a driving wheel 13 which will be described later while being supported by two adjoining first tracks 31. The suspension traveling vehicle 10 can also travel in the second direction by rotating a driving wheel 13 while being supported by two adjoining second tracks 32.

A processor 50, a load port 51, a storage 52, and the like are disposed below the track 30. The processor 50 is a device that performs various processes on a semiconductor wafer or the like. The load port 51 is connected to a space in which the processor 50 performs a process. The semiconductor wafers conveyed by the suspension traveling vehicle 10 (specifically, the FOUP containing the semiconductor wafers) are placed on the load port 51. Thereafter, semiconductor wafers are conveyed from the FOUP by, for example, a robot arm, and the semiconductor wafers are processed by the processor 50. The FOUP accommodating the processed semiconductor wafers are transported by the same or another suspension traveling vehicle 10 to a location where another step is performed. The storage 52 is a device that temporarily stores the FOUP or the like when the processor 50 and the load port 51 are in use or the like until they can be used. The storage 52 is a suspending shelf, for example.

Figure 2:
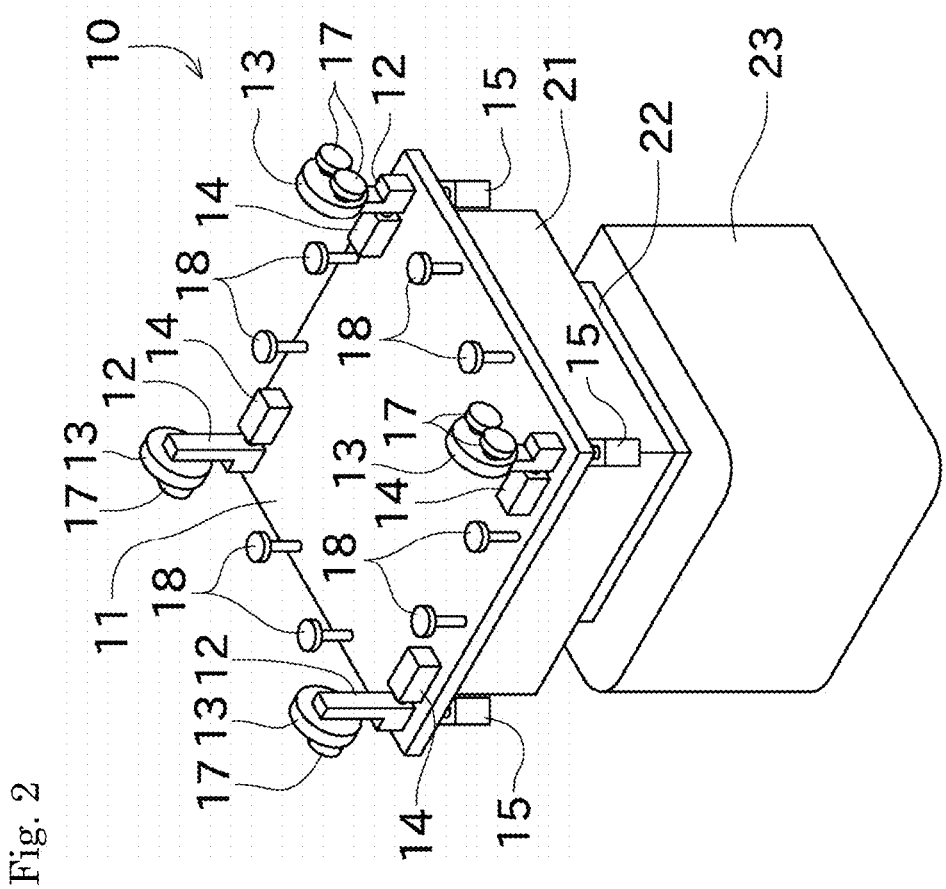
FIG. 2 is a perspective view showing a configuration of a suspension traveling vehicle.

Next, referring to FIG. 2, the configuration of the suspension traveling vehicle 10 will be described. FIG. 2 is a perspective view showing a configuration of the suspension traveling vehicle 10.

As shown in FIG. 2, the suspension traveling vehicle 10 includes a base 11. The base 11 is a rectangular or substantially rectangular plate to which various members of the suspension traveling vehicle 10 are attached. A supporting body 12 is disposed at four corners of the base 11 so as to rise upward from the base 11. The driving wheel 13 is attached to the supporting body 12. As details will be described later, the driving wheel 13 is configured to contact the upper surface of the first track 31 or the second track 32.

A traveling motor 14 is disposed on the upper surface of the base 11 in the vicinity of each of the four supporting bodies 12. A driving force generated by the traveling motor 14 is transmitted to the driving wheel 13 via a power transmission (not shown). As a result, the suspension traveling vehicle 10 travels by a rotation of the driving wheel 13 about an axle direction (horizontal direction). Turning motor 15 is disposed below each of the four supporting bodies 12. The turning motor 15 can rotate driving wheel 13 about a vertical direction as a rotational axis. Accordingly, the orientation of the driving wheel 13 can be changed by 90 degrees in the plan view. Thus, by changing the orientation of the driving wheel 13 by 90°, it is possible to switch between a state in which the suspension traveling vehicle 10 is movable along the first track 31 and a state in which the suspension traveling vehicle 10 is movable along the second track 32.

The suspension traveling vehicle 10 includes, in addition to driving wheel 13, an upper auxiliary wheel 17 and a lower auxiliary wheel 18 to travel smoothly along track 30. The upper auxiliary wheel 17 and the lower auxiliary wheel 18 are not driven by a motor or the like, and rotate as the suspension traveling vehicle 10 travels. The upper auxiliary wheel 17 is rotatable about a horizontally direction as a rotational axis. The upper auxiliary wheel 17 is aligned with the driving wheel 13 in the wheel width direction. The upper auxiliary wheel 17 is disposed so that a position of a lower end of the upper auxiliary wheel 17 is higher than a position of a lower end of the driving wheel 13. The lower auxiliary wheel 18 is rotatable about a vertical direction as a rotational axis. The lower auxiliary wheel 18 is disposed above the base 11 so that a position of an upper end of the lower auxiliary wheel 18 is higher than a position of a lower end of the driving wheel 13.

The suspension traveling vehicle 10 includes a transfer device 21, a holding device 22, and a storage container 23 below the base 11. The transfer device 21 includes a mechanism (a hoist or the like) to move the storage container 23 in the vertical direction and a mechanism (an arm mechanism being capable of expanding and contacting in the horizontal direction or the like) to move the storage container 23 in the horizontal direction. The holding device 22 is configured to be able to hold an upper portion of the storage container 23. The storage container 23 is a container to accommodate semiconductor wafers or the like. As described above, the suspension traveling vehicle 10 is configured to suspend and convey the storage container 23 which is the conveyance object.

Figure 3:
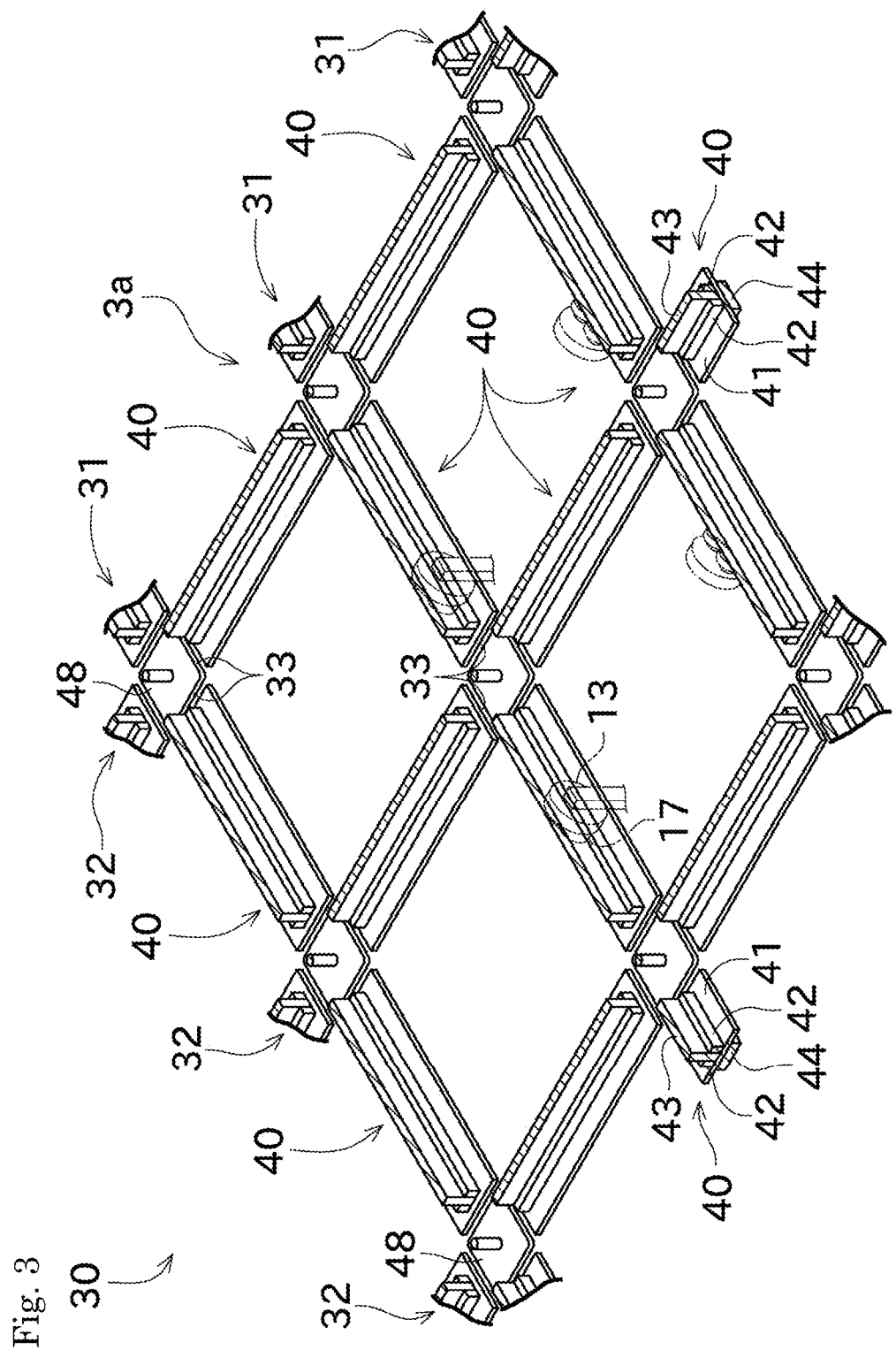
FIG. 3 is a partial cross-sectional perspective view of a track disposed in a grid area.
Figure 4:
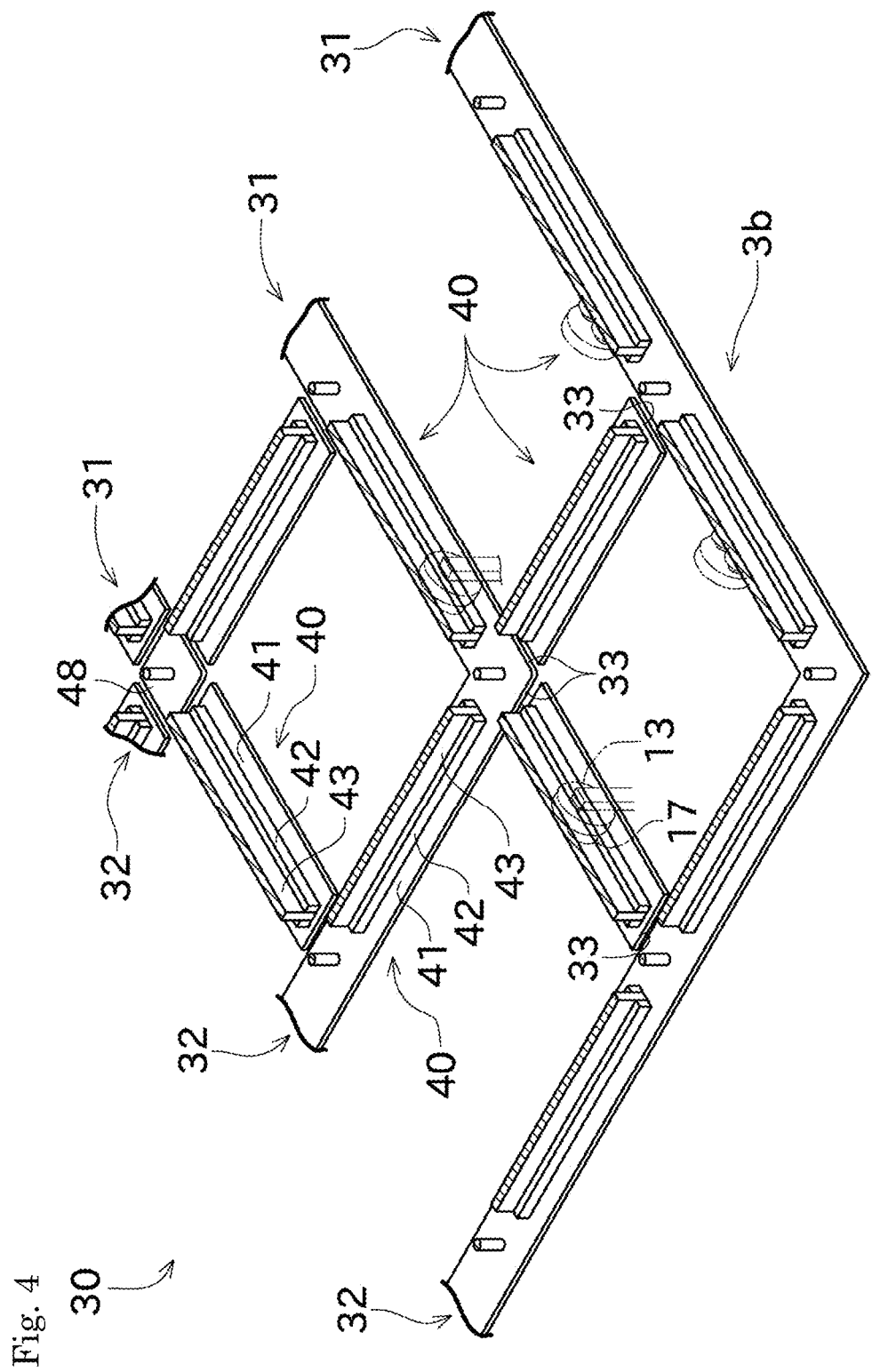
FIG. 4 is a partial cross-sectional perspective view of a track disposed in a linear area.

Next, referring further to FIGS. 3 and 4, the track 30 (in particular the difference between the grid area 3a and the linear area 3b) in which the suspension traveling vehicle 10 travels will be described. FIG. 3 is a partial cross-sectional perspective view of the track 30 disposed in the grid area 3a. FIG. 4 is a partial cross-sectional perspective view of the track 30 disposed in the linear area 3b.

As described above, the track 30 includes a plurality of the first tracks 31 and a plurality of the second tracks 32. As shown in FIG. 3, the first tracks 31 include rails 40 aligned in a longitudinally direction and crossing members 48 disposed between the rails 40 with an interstice 33 therebetween. The second tracks 32 also include, in the same manner of the first tracks 31, rails 40 aligned in a longitudinally direction and crossing members 48 disposed between the rails 40 with an interstice 33 therebetween. The interstice 33 is a space to allow the supporting body 12 to pass through when the suspension traveling vehicle 10 is traveling.

The rail 40 and the crossing member 48 are connected to each other at the upper side via another member. The crossing member 48 is common between the first track 31 and the second track 32. In the present preferred embodiment, the rail 40 of the first track 31 and the rail 40 of the second track 32 have the same shape.

The rail 40 includes a driving wheel support 41, an upper auxiliary wheel support 42, a partition 43, and a lower auxiliary wheel support 44.

The driving wheel support 41 includes a plate disposed so that its thickness direction is the same as the vertical direction. The driving wheel support 41 includes a support surface on its upper surface to contact the driving wheel 13 (in particular, the lower end of the driving wheel 13). The rails 40 (the driving wheel supports 41) face each other, the arrangement interval of the rails 40 is the same as that of the driving wheels 13. With this configuration, the suspension traveling vehicle 10 is supported by track 30 by using the four driving wheels 13 and the four supporting bodies 12 included in the suspension traveling vehicle 10.

The upper auxiliary wheel support 42 extends upward from an upper surface of the driving wheel support 41. The upper auxiliary wheel support 42 includes a support surface on its upper surface to contact the upper auxiliary wheel 17 (in particular, the lower end of the upper auxiliary wheel 17). Since the suspension traveling vehicle 10 includes the upper auxiliary wheel 17 in addition to the driving wheel 13, the suspension traveling vehicle 10 is able to be more stably supported.

One rail 40 is used both when traveling on one side (one side in a short direction) of the rail 40 and when traveling on the other side (the other side in the short direction) of the rail 40. Thus, one rail 40 includes the two upper auxiliary wheel supports 42. A partition 43 is disposed between the two upper auxiliary wheel supports 42.

The lower auxiliary wheel support 44 extends downward from a lower surface of the driving wheel support 41. The lower auxiliary wheel support 44 includes a support surface on its side surface to contact the lower auxiliary wheel 18 (in particular, the radial end of the lower auxiliary wheel 18). The lower auxiliary wheel 18 allows the suspension traveling vehicle 10 to travel smoothly along the track 30. One surface of the lower auxiliary wheel support 44 is used as the contact surface when traveling on one side (one side in a short direction) of the rail 40, and the other surface of the lower auxiliary wheel support 44 is used as the contact surface when traveling on the other side (the other side in the short direction) of the rail 40.

The traveling area 3 of the suspension traveling vehicle 10 includes the grid area 3a and the linear area 3b as described above. In the grid area 3a, as shown in FIGS. 1 and 3, the first track 31 and the second track 32 are disposed in a grid pattern. In particular, the first tracks 31 are disposed at an equal or substantially equal interval in which the suspension traveling vehicle 10 can travel between the first tracks 31, and the second tracks 32 are disposed at an equal or substantially equal interval in which the suspension traveling vehicle 10 can travel between the second tracks 32. When an area surrounded by the first tracks 31 and the second tracks 32 is referred to an unit block, the same-shaped unit blocks align with the first direction and the second direction. In the all unit block of the grid area 3a, interstices 33 are provided in both the first tracks 31 and the second tracks 32 surrounding the unit block. Although there are the two first tracks 31 and the two second tracks 32 surrounding the unit block, the interstice 33 may be provided on at least one of the two first tracks 31 and at least one of the two second tracks 32. For example, at the end of the grid area 3a, there is no need to provide the interstice on the first track 31 or the second track 32 of the end side.

This configuration allows the suspension traveling vehicle 10 to travel in both the first direction and the second direction even when the suspension traveling vehicle 10 is located in any of the unit blocks. Therefore, since various routes can be realized, even when the number of suspension traveling vehicle 10 to be operated is large, it becomes easy to travel to a destination while avoiding each other. Since the suspension traveling vehicle 10 can travel in a wider area, the accommodating area 4 in which the load port 51, storage 52, and the like are provided below the grid area 3a can be secured in a wider area, so that a larger amount of articles can be accommodated.

On the other hand, in grid area 3a, the driving wheel 13 rides over the interstice 33 every time the driving wheel 13 moves from one unit block to the next unit block. For example, if the suspension traveling vehicle 10 travels in the first direction, the driving wheel 13 needs to ride over the interstice 33 along the second direction. As a result of this, the suspension traveling vehicle 10 is easily vibrated. Therefore, it is not preferable to move at a high speed in order to protect the semiconductor wafer accommodated in the storage container 23. Even when the semiconductor wafer is not accommodated in the storage container 23, it may not be preferable to move at high speed in order to reduce or minimize loads applied to the suspension traveling vehicle 10. Furthermore, since the suspension traveling vehicle 10 can travel in various directions, it is not preferable that the suspension traveling vehicle 10 travels at high a speed in order to reliably avoid a collision.

When the suspension traveling vehicle 10 travels in the grid area 3a, the maximum speed of the suspension traveling vehicle 10 needs to be lowered. In view of this point, in the present preferred embodiment, the linear area 3b capable of running at high speed is provided in addition to the grid area 3a. Hereinafter, the linear area 3b will be described in detail.

The linear area 3b includes only one of the first tracks 31 and the second tracks 32. In other words, since the first tracks 31 and the second tracks 32 do not cross each other in the linear area 3b, the traveling directions of the suspension traveling vehicle 10 cannot be changed between the first direction and the second direction. That is, the traveling directions are defined as the first direction or the second direction. The interstice 33 does not need to be provided because the traveling direction is not changed, and the interstice 33 perpendicular or substantially perpendicular to the traveling direction is not provided in the linear area 3b. For example, in the linear area 3b where the traveling direction is defined as the first direction, the interstice 33 along the second direction, that is the interstice 33 required to move the supporting body 12 in the second direction, is not provided. In the present preferred embodiment, the first track 31 or the second track 32 includes a member in which the rail 40 and the crossing member 48 of the grid area 3a are connected to each other so as to fill the interstice 33.

With this configuration, in the linear area 3b, since the driving wheel 13 does not ride over the interstice 33 (there is no interstice 33 required to be ridden over) while the suspension traveling vehicle 10 traveling, too large a vibration is not generated even when the suspension traveling vehicle 10 travels at high speed. Therefore, when the semiconductor wafer is accommodated in the storage container 23, the suspension traveling vehicle 10 can travel at high speed while the vibration applied to the semiconductor wafer are reduced.

Therefore, the maximum speed of the linear area 3b higher than that of the grid area 3a is set. In order to control the maximum speed, a detector to detect the present position of the suspension traveling vehicle 10 is provided, data in which the positions of the grid area 3a and the linear area 3b are stored, and a controller to control the speed of the suspension traveling vehicle 10. As a detector, there is a configuration in which the suspension traveling vehicle 10 reads identifiers (bar code, RFID, etc.) disposed in track 30. If the present position of the suspension traveling vehicle 10 is in the linear area 3b, the traveling motor 14 of the suspension traveling vehicle 10 is controlled so as not to exceed the maximum speed set in the linear area 3b. This control may be performed by a controller included in the suspension traveling vehicle 10, by a controller that controls the conveyance system 1, or by both of the control devices cooperatively.

As described above, the suspension traveling vehicle 10 cannot change the traveling directions in the linear area 3b. Furthermore, the suspension traveling vehicle 10 cannot enter from the grid area 3a to an intermediate portion of the linear area 3b. Thus, for example, if there is a long linear area 3b in a center of the traveling area 3, the suspension traveling vehicle 10 may bypass this long linear area 3b in order to reach a destination. Therefore, it is preferable that the linear area 3b is provided along an edge of the traveling area 3 as in the first preferred embodiment. With this configuration, the linear area 3b is utilized, while preventing from interfering with the suspension traveling vehicle 10 which travels in the grid area 3a. However, depending on a layout of the facility, there may be no problem even if a long linear area 3b is provided in the center of traveling area 3.

In linear area 3b, when the traveling direction is defined as the first direction, the suspension traveling vehicle 10 can travel in both one side of the first direction and the other side of the first direction. In this case, if the two suspension traveling vehicles 10 travel closer to each other along the same linear area 3b, one suspension traveling vehicle 10 needs to return along the linear area 3b. In order to avoid this situation, it may be defined that traveling toward one side of the first direction (or the second direction) is enable instead of defining only the first direction (or the second direction).

In the present preferred embodiment, the linear area 3b along the first direction and the linear area 3b along the second direction are connected. Instead of this configuration, a linear area 3b along only one of the first direction or the second direction may be provided.

Figure 5:
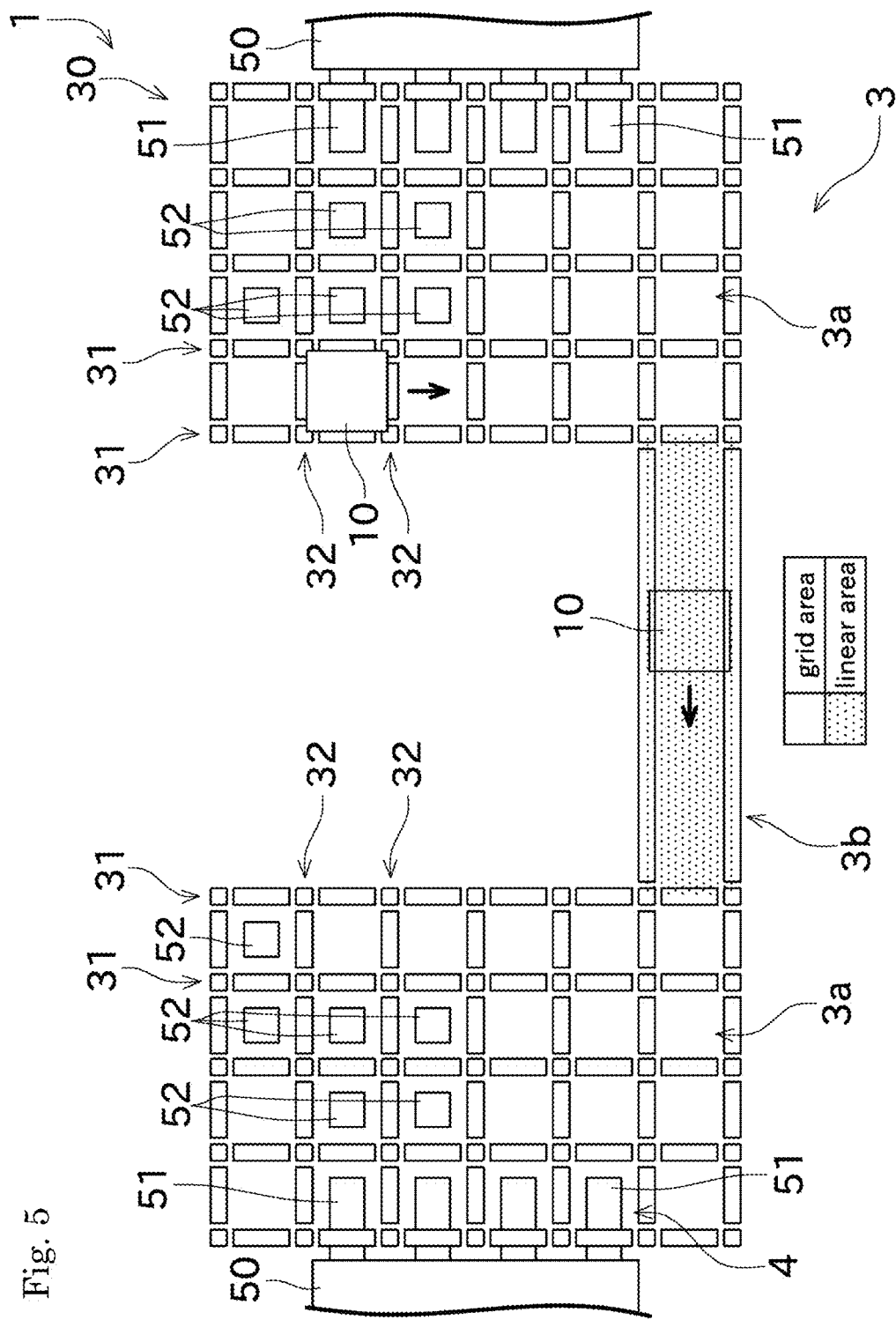
FIG. 5 is a schematic plan view showing a configuration of a conveyance system of a second preferred embodiment of the present invention.

Next, a second preferred embodiment of the present invention will be described with reference to FIG. 5. FIG. 5 is a schematic plan view showing a configuration of a conveyance system of the second preferred embodiment. In below explanation, members identical or similar to those of the first preferred embodiment will be given the same reference signs on the drawings, and their descriptions may be omitted.

In the first preferred embodiment, both the grid area 3a and the linear area 3b are included in one section (one bay). On the other hand, in the second preferred embodiment, the path to connect differing sections (an area for transferring between inter bay transfer areas) is configured as the linear area 3b. Since the distances between the different sections may be long and there is no need to change the traveling direction on the way, the advantages of linear area 3b are able to be effectively utilized.

In the second preferred embodiment, the two sections are connected through the one linear area 3b, but the two sections are may be connected through a plurality of (e.g., two) linear areas 3b. In this case, by separating a linear area 3b for traveling from the first section to the second section from a linear area 3b for traveling from the second section to the first section, efficient conveyance is able to be achieved.

As described above, the conveyance system 1 of the present preferred embodiment includes the traveling area 3 and the suspension traveling vehicle 10. The traveling area 3 includes a plurality of the first tracks 31 disposed along the first direction and a plurality of the second tracks 32 disposed along the second direction perpendicular or substantially perpendicular to the first direction. The suspension traveling vehicle 10 includes the supporting body 12, and travels on the traveling area 3 while being supported by the first tracks 31 or the second tracks 32 by the supporting body 12. The traveling area 3 includes the grid area 3a and the linear area 3b. In the grid area 3a, the plurality of the first tracks 31 are disposed side by side, and the plurality of the second tracks 32 are disposed side by side so that the first tracks 31 and the second tracks 32 intersect. Consequently, the grid area 3 includes a plurality of the unit blocks of the same shape or substantially the same shape surrounded by the first tracks 31 and the second tracks 32. In the grid area 3a, both the first tracks 31 and the second tracks 32 surrounding the unit block are provided with an interstice 33 to allow the supporting body to pass 12, and the interstice 33 is perpendicular or substantially perpendicular to the longitudinal direction of each track (the first track 31 or the second track 32). The traveling direction is the same or substantially the same as the first direction or the second direction in the linear area 3b, and the interstice 33 perpendicular or substantially perpendicular to the traveling direction is not provided in the linear area 3b.

Accordingly, since the plurality of the first tracks 31 and the plurality of the second tracks 32 are disposed so as to have the plurality of the unit blocks of the same shape or substantially the same shape in the grid area 3a, articles can be conveyed to various positions in various paths in the grid area 3a. In the grid area 3a, because of traveling of the suspension traveling vehicle 10 in various directions and a large number of interstices 33 to allow the supporting body to pass 12, the suspension traveling vehicle 10 tends to be vibrated by passing over the interstices 33. In this regard, the present preferred embodiment includes the linear area 3b in addition to the grid area 3a. Since the suspension traveling vehicle 10 can travel only in a predetermined travel direction in the linear area 3b, no other suspension traveling vehicle 10 enters the linear area 3b from a direction crossing the travel direction. Therefore, since the possibility of collision of the suspension traveling vehicles 10 is extremely low in the linear area 3b, the suspension traveling vehicle 10 can be allowed to travel at high speed. In particular, since the interstice 33 perpendicular or substantially perpendicular to the traveling direction is not provided in the linear area 3b, the vibration in the linear area 3b of the suspension traveling vehicle 10 during the traveling are reduced. Therefore, in the linear area 3b, even when an article which is vulnerable to vibration is conveyed, the suspension traveling vehicle 10 can be allowed to travel at high speed.

In the conveyance system 1 of the above preferred embodiment, maximum traveling setting speed of the suspension traveling vehicle 10 in the linear area 3b is faster than maximum traveling setting speed of the suspension traveling vehicle 10 in the grid area 3a.

This makes it possible to utilize the feature of the linear area 3b that the suspension traveling vehicle 10 can be allowed to travel at high speed.

In the conveyance system 1 of the above preferred embodiment, the suspension traveling vehicle 10 travels while suspending an article to be conveyed. The accommodating area 4 for accommodating the article is provided below the grid area 3a.

Accordingly, a space below the grid area 3a can be utilized. In particular, by shortening intervals between the first tracks 31 and the second tracks 32, the space below the grid area 3a can be more effectively utilized.

In the conveyance system 1 of the above preferred embodiment, the article is the storage container 23 to store the semiconductor wafer. The accommodating area 4 is provided with the load port 51 where the semiconductor wafer is transferred to the processor 50 that processes the semiconductor wafer, or the storage 52 to temporarily store the storage container 23 to be transferred the semiconductor wafer to the load port 51.

Accordingly, since the semiconductor wafer is sensitive, the features of a preferred embodiment of the present invention that the vibration is reduced or minimized and conveying at high speed are able to be effectively utilized. The accommodating area 4 is provided with the load port or the storage, so the space below the grid area is able to be effectively utilized.

Although preferred embodiments of the present invention have been described above, the configurations described above can be modified, for example, as follows.

In the above preferred embodiments, the interval of the driving wheels 13 in the first direction and the interval of the driving wheels 13 in the second direction of the suspension traveling vehicle 10 are the same. Therefore, since the interval between the first tracks 31 and the interval between the second tracks 32 are the same, the unit block is a square. Alternatively, the interval of the driving wheels 13 in the first direction and the interval of driving wheels 13 in the second direction of suspension traveling vehicle 10 may be different. In this case, since the interval between the first tracks 31 and the interval between the second tracks 32 are different, the unit block is a rectangular or substantially rectangular shape.

The linear area 3b along the first direction is provided with a pair of the first tracks 31 disposed in parallel or substantially in parallel. Alternatively, a reinforcing member to connect the pair of the first tracks 31 (rail 40) may be provided. In this case, in order to secure a space to allow the supporting body to pass 12, an interstice is provided between the reinforcing member and the first track 31 as necessary or desired.

In the above preferred embodiments, the conveyance system disposed in the semiconductor manufacturing facility is described. Alternatively, the conveyance systems of preferred embodiments of the present invention may be disposed in other facilities.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A conveyance system comprising:
a traveling area that includes a plurality of first tracks disposed along a first direction and a plurality of second tracks disposed along a second direction perpendicular or substantially perpendicular to the first direction; and
a suspension traveling vehicle that includes a supporting body, and travels on the traveling area while being supported by the first tracks or the second tracks by the supporting body; wherein
the traveling area includes:
a grid area that includes the plurality of the first tracks disposed side by side and the plurality of the second tracks disposed side by side so that the first tracks and the second tracks intersect, and includes a plurality of unit blocks of the same shape or substantially the same shape surrounded by the first tracks and the second tracks, both the first tracks and the second tracks surrounding the unit blocks being provided with an interstice that is perpendicular or substantially perpendicular to the longitudinal direction of each track in order to allow the supporting body to pass;
a linear area in which a traveling direction is the same or substantially the same as the first direction or the second direction and in which an interstice perpendicular or substantially perpendicular to the traveling direction is not provided.

2. The conveyance system according to claim 1, wherein a maximum traveling setting speed of the suspension traveling vehicle in the linear area is faster than a maximum traveling setting speed of the suspension traveling vehicle in the grid area.

3. The conveyance system according to claim 1, wherein the suspension traveling vehicle travels while suspending an article to be conveyed; and
an accommodating area to accommodate the article is provided below the grid area.

4. The conveyance system according to claim 3, wherein the article is a storage container to store a semiconductor wafer; and
the accommodating area is provided with a load port where the semiconductor wafer is transferred to a processor that processes the semiconductor wafer, or a storage to temporarily store the storage container to be transferred the semiconductor wafer to the load port.

* * * * *